(12) United States Patent
Peidous et al.

(10) Patent No.: US 7,635,648 B2
(45) Date of Patent: Dec. 22, 2009

(54) METHODS FOR FABRICATING DUAL MATERIAL GATE IN A SEMICONDUCTOR DEVICE

(75) Inventors: Igor Peidous, Loudonville, NY (US); Victor Ku, Yorktown Heights, NY (US); Joe Piccirillo, Hopewell Junction, NY (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/100,557

(22) Filed: Apr. 10, 2008

(65) Prior Publication Data

US 2009/0258484 A1  Oct. 15, 2009

(51) Int. Cl.
*H01L 21/311* (2006.01)
(52) U.S. Cl. .................. 438/700; 438/9; 438/238; 438/381; 438/742; 257/E21.17; 257/E21.304; 257/E21.311; 257/E21.585; 257/E21.646
(58) Field of Classification Search .............. 438/9, 438/238, 381, 197, 513, 663, 680, 692, 700 438/742, 789, 954
See application file for complete search history.

(56) References Cited

U.S. PATENT DOCUMENTS

| | | | | |
|---|---|---|---|---|
| 5,591,664 A * | 1/1997 | Wang et al. | ............... | 438/254 |
| 5,670,404 A * | 9/1997 | Dai | ............... | 438/239 |
| 6,010,925 A * | 1/2000 | Hsieh | ............... | 438/197 |
| 6,653,698 B2 * | 11/2003 | Lee et al. | ............... | 257/407 |
| 6,828,181 B2 | 12/2004 | Chen et al. | | |
| 7,057,243 B2 | 6/2006 | Yamada et al. | | |
| 7,064,036 B2 * | 6/2006 | Zahurak et al. | ............... | 438/283 |
| 7,078,302 B2 * | 7/2006 | Ma et al. | ............... | 438/299 |
| 7,164,178 B2 * | 1/2007 | Yoneda | ............... | 257/411 |
| 7,462,562 B2 * | 12/2008 | Fujita | ............... | 438/700 |
| 2003/0109121 A1 | 6/2003 | Rotondaro | | |
| 2003/0137017 A1 | 7/2003 | Hisamoto et al. | | |
| 2004/0132271 A1 | 7/2004 | Ang et al. | | |
| 2005/0145944 A1 | 7/2005 | Murthy et al. | | |

* cited by examiner

*Primary Examiner*—David Nhu
(74) *Attorney, Agent, or Firm*—Patterson & Sheridan, LLP

(57) ABSTRACT

A method for fabricating dual material gate structures in a device is provided. The dual material gate structures have different gate electrode materials in different regions of the device. In one embodiment, the method includes providing a substrate having a patterned first gate electrode and a patterned first gate dielectric layer disposed on the substrate, removing a portion of the first gate electrode from the substrate to define a trench on the substrate, and filling the trench to form a second gate electrode.

21 Claims, 8 Drawing Sheets

METHODS FOR FABRICATING DUAL MATERIAL GATE IN A SEMICONDUCTOR DEVICE

BACKGROUND

1. Field

Embodiments of the present invention generally relate to methods for fabricating dual material gate structures suitable for semiconductor devices. More specifically, embodiments of the invention relate to methods of fabricating gate structures having different gate electrode materials in different regions of semiconductor devices.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

Generally, different transistors formed in different regions of an integrated circuit may require different electrical performance. For example, during fabricating a metal oxide semiconductor (MOS) transistor device, such as a complementary metal oxide semiconductor (CMOS), it is often desired to increase electron mobility and gate activation in n-type MOS device (NMOS) channels but to increase positive charged holes mobility and dopant activation in p-type MOS (PMOS) channels. In contrast, reduction of gate depletion effect of carriers is desired in both NMOS and PMOS region of the devices for minimum parasitic resistance and larger threshold voltage. Accordingly, different electrical performance, threshold voltage and work function requirements in n-type and p-type regions of a device presents a significant fabrication challenge.

FIGS. 1A-1C depict one embodiment of a device fabricated by a conventional fabrication process having n-type and p-type gate structure made from a similar material. FIG. 1A depicts a top view of a device structure having an n-type region 102 and a p-type region 104 formed on a substrate 108. In one embodiment, the n-type region 102 may have n-type field effect transistor (NFET) formed therein while the p-type region 104 may have p-type field effect transistor (PFET) formed therein. The n-type region 102 and p-type region 104 are aligned side by side within the device. Source 112 and drain 114 regions are formed in the substrate 108 underneath gate structures 160. The gate structure 160 includes a gate electrode layer 106 disposed on a gate dielectric layer 116. A dielectric layer 118, such as an interlayer dielectric layer (IDL), is disposed on the substrate 108 circumscribing the gate structure 160.

FIG. 1B depicts a cross sectional view of the gate structure 160 taken along the section line A-A'. The gate electrode layer 106 is disposed on the gate dielectric layer 116 on the substrate 108. Shallow trench isolations (STI) 120 fabricated from oxide materials is formed to isolate each n-type region and p-type region transistors formed on the gate structure 160.

FIG. 1C depicts another cross sectional view of the substrate 108 taken along the section line B-B'. The gate electrode layer 106 and the gate dielectric layer 116 are patterned to a predetermined critical dimension at a predetermined location on the substrate 108 between the source region 112 and drain region 114. The ILD layer 118 is deposited in between each gate structure 160, e.g., the gate electrode layer 106 and gate dielectric layer 116, formed on the substrate 108.

As the gate electrode layer 106 formed on the substrate 108 is utilized for both the n-type region 102 and the p-type region 104 devices, the electrical properties of the devices formed in the n-type region 102 and p-type region 104 are limited to the specific electrical performance properties for material selected for the gate electrode layer 106. The limitation of the material properties selected for fabricating the gate electrode 106 may only provide a specific work function in a certain range, thereby limiting the ability to meet different device requirements for both the n-type region 102 and the p-type region 104 of the substrate.

Therefore, there is a need for a method for fabricating a transistor having different electric performance at different regions.

SUMMARY

Embodiments of the invention include a method for fabricating a dual material gate structure in transistors that can independently control and adjust work function in n-type and p-type regions of the transistors. The dual material gate structures have different gate electrode materials in different regions of the device. In one embodiment, the method includes providing a substrate having a patterned first gate electrode and a patterned first gate dielectric layer disposed on the substrate, removing a portion of the first gate electrode from the substrate to define a trench on the substrate, and filing the trench to from a second gate electrode.

In another embodiment, the method includes providing a substrate having a dielectric layer disposed thereon, wherein the dielectric layer has a first group of trenches disposed on a first region of the substrate and a second group of trenches disposed on a second region of the substrate, wherein the trenches are filled with a first gate electrode disposed on a first gate dielectric layer, removing a portion of the first gate electrode disposed in the first group of the trenches formed on the first region of the substrate, depositing a second gate electrode over the dielectric layer and filling first group of the trenches with the second gate electrode, and removing a portion of the second gate electrode not filling the first group of trenches.

In yet another embodiment, the method includes providing a substrate having a first gate electrode disposed on a first region and a second region of the substrate, removing the first gate electrode disposed on the first region of the substrate, and depositing a second gate electrode on the first region of the substrate after the first gate electrode has been removed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

Figure 1A:
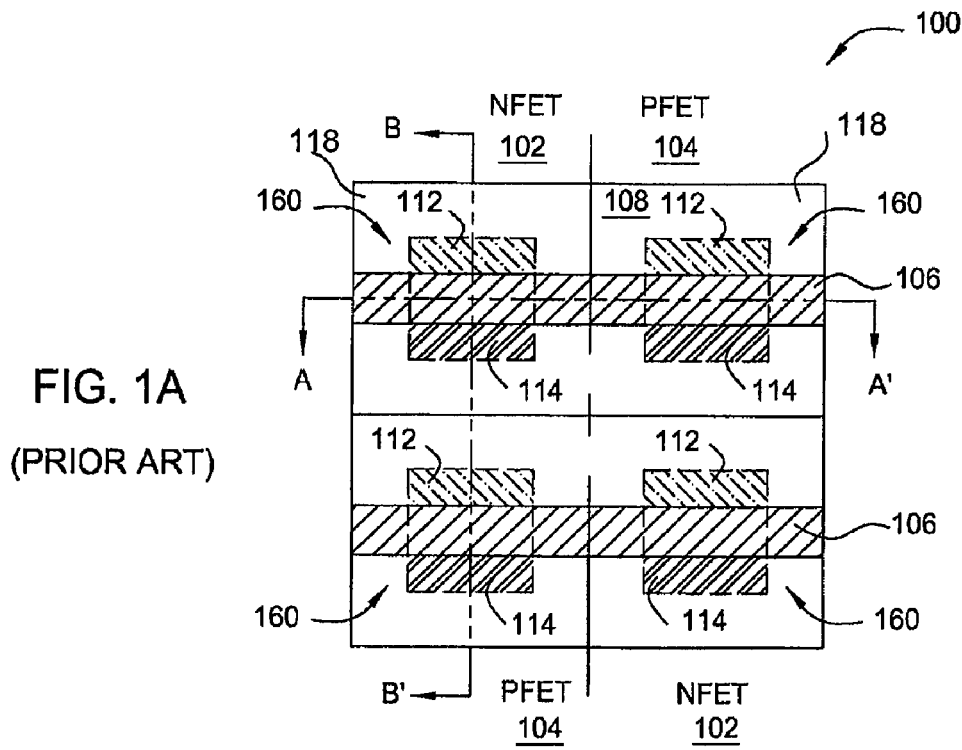
FIGS. 1A-1C depict plan and sectional view of a conventional embodiment of a transistor.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention include methods for fabricating devices that allow different gate materials for gate structures to be chosen for different types of transistors. The present inventions eliminate several implantation and/or mask processes conventionally used for forming devices in p-type regions and n-type regions while forming different gate materials for gate structures in different regions. In one embodiment a method for fabricating a dual material gate structure is provided that includes different gate electrode materials in a n-type region and a p-type region on a substrate. Dual gate material structure provides different work functions in different regions of the device, thereby allowing the electrical performance in n-type and p-type region of the device to be independently chosen. Accordingly, a tunable work function of gate structure is provided.

Figure 1B:
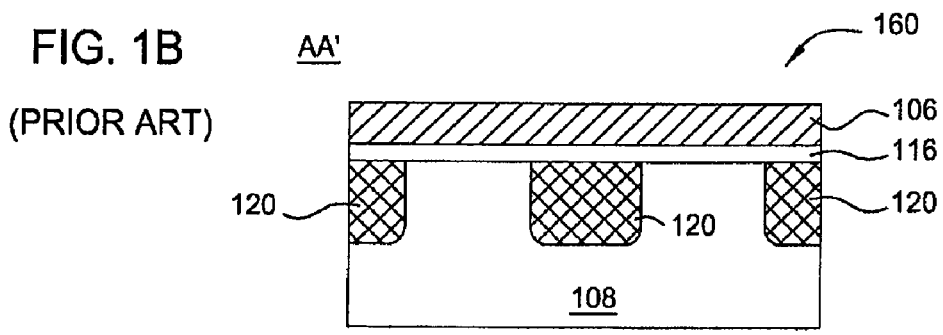
Figure 1C:
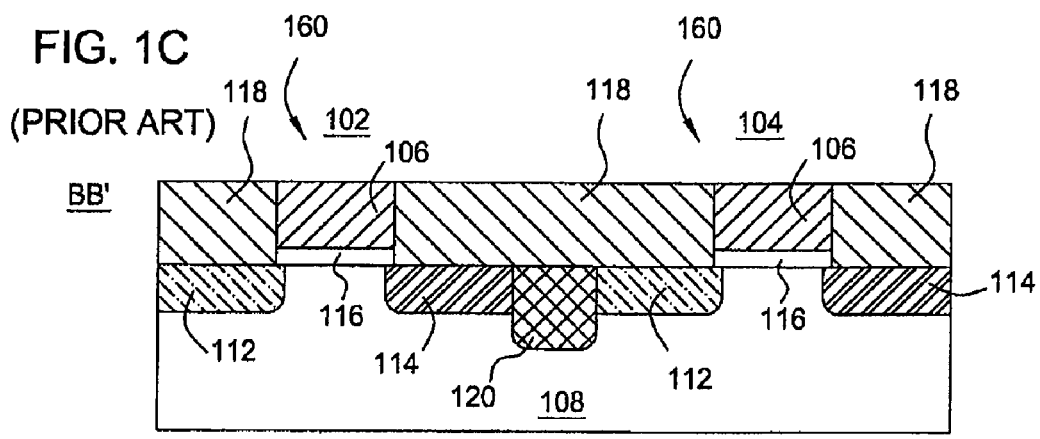
Figure 2:
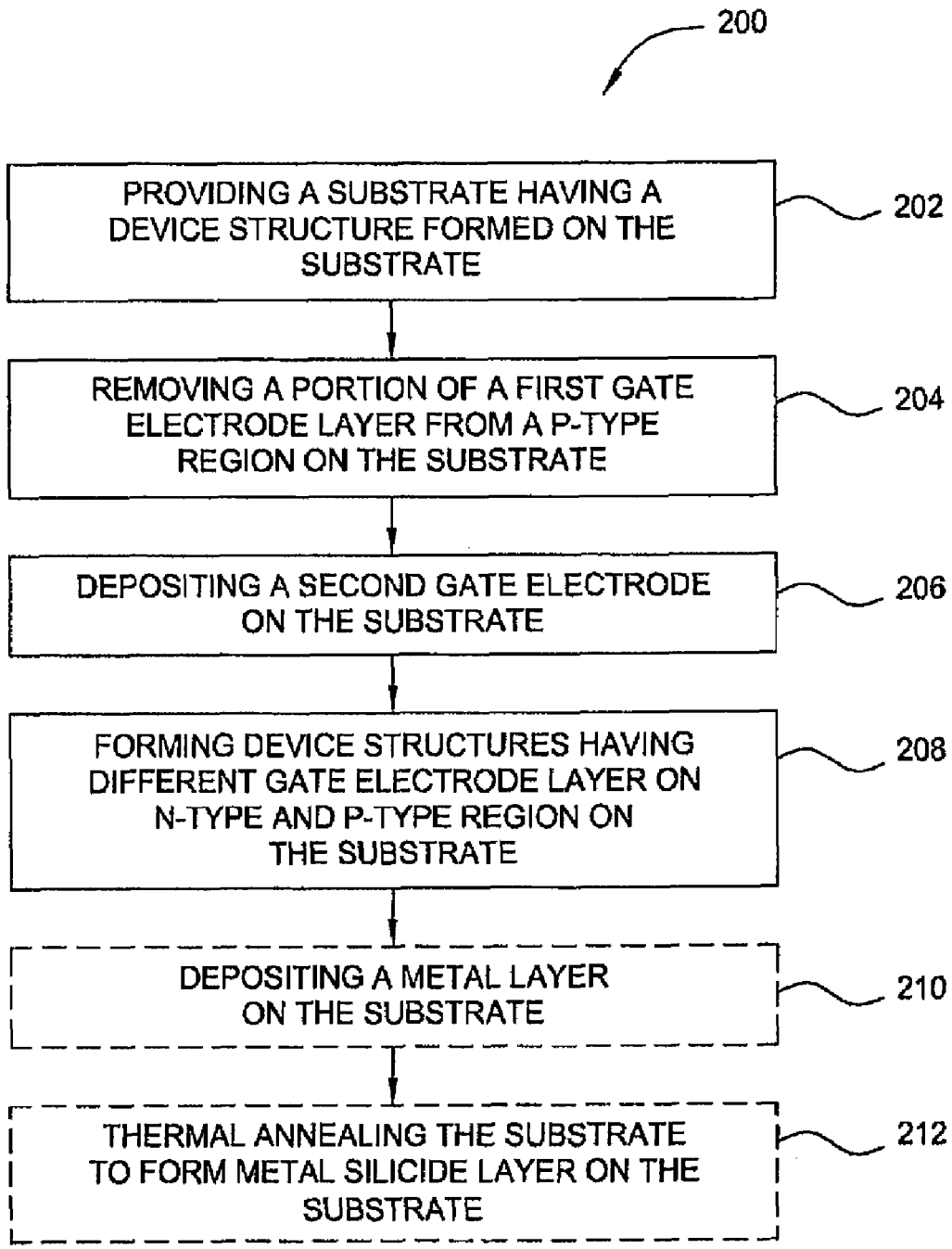
FIG. 2 depicts a process flow diagram illustrating a method for a transistor having different gate materials in different regions of the transistor.

FIG. 2 depicts a process flow diagram illustrating a method 200 for fabricating a transistor that may independently provide different work functions of gate materials. The method 200 begins at block 202 by providing a substrate, such as the substrate 108 of FIGS. 1A-1C, having a gate structure 160 formed on the substrate 108. The gate structure 160 includes a first gate electrode 106 and a first gate dielectric layer 116 formed on both n-type region 102 and p-type region 104 on the substrate 108. The gate structure 160 is patterned by suitable patterning technique. An interlayer dielectric layer (ILD) 118 is deposited on the substrate 108 circumscribing the gate structure 150. The n-type region 102 and p-type region 104 each has a source 112 and a drain region 114 formed underneath the gate structure 160 electrically isolating and separating by shallow trench isolations (STI) 120 formed in between.

In one embodiment, the first gate electrode 106 may be fabricated from a doped silicon material, a metal material, or combinations thereof. For example, the gate electrode 106 may be fabricated from a polysilicon material doped with phosphorus (P), arsenic (As), antimony (Sb), having n-type conductivity to form n-type region 102 or doped with boron (B), having p-type conductivity to form p-type region 104. Alternatively, a variety of different dopants, such as germanium (Ge), carbon (C), or other elements, may also be utilized as materials for forming the gate electrode 106. In another embodiment, the gate electrode 106 may further include one or more metal materials formed below a doped polysilicon material or a metal material, such as tungsten (W), titanium (Ti), tantalum (Ta), molybdenum (Mo), ruthenium (Ru), tungsten nitride (WN), titanium nitride (TiN), tantalum nitride (TaN), molybdenum nitride (MoN). compounds thereof, alloys thereof, or combinations thereof.

In one embodiment, the first gate dielectric layer 116 is high-k dielectric material, e.g., a dielectric material having dielectric constant greater than 4.0. Suitable examples of high-k materials include, but not limited to, silicon oxide ($SiO_2$), silicon nitride (SiN), silicon oxynitride (SiON), hafnium oxide (HfO), hafnium silicate ($HfSiO_4$), hafnium disilicate ($HfSi_4O_7$), zirconium oxide (ZrO), zirconium silicate ($ZrSiO_4$), tantalum oxide ($Ta_2O_5$), titanium oxide ($TiO_2$), titanium nitride (TiN), tantalum nitride (TaN), tantalum silicon nitride (TaSiN), aluminum oxide, aluminum doped hafnium dioxide, bismuth strontium titanium (BST), platinum zirconium titanium (PZT), and combinations thereof, among others. In some embodiment, the first gate dielectric layer 116 may be in form of a composite film having one or more materials formed as a gate dielectric layer. Materials for forming the composite film may be selected from the materials utilized to fabricate the first gate dielectric layer 116 as discussed above.

Figure 3A:
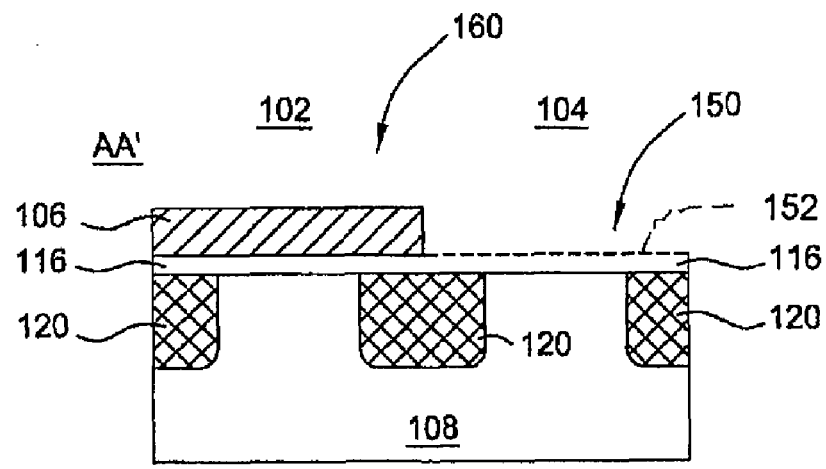
FIGS. 3A-3B depict a transistor having a portion of a first gate electrode layer removed from the transistor.
Figure 3B:
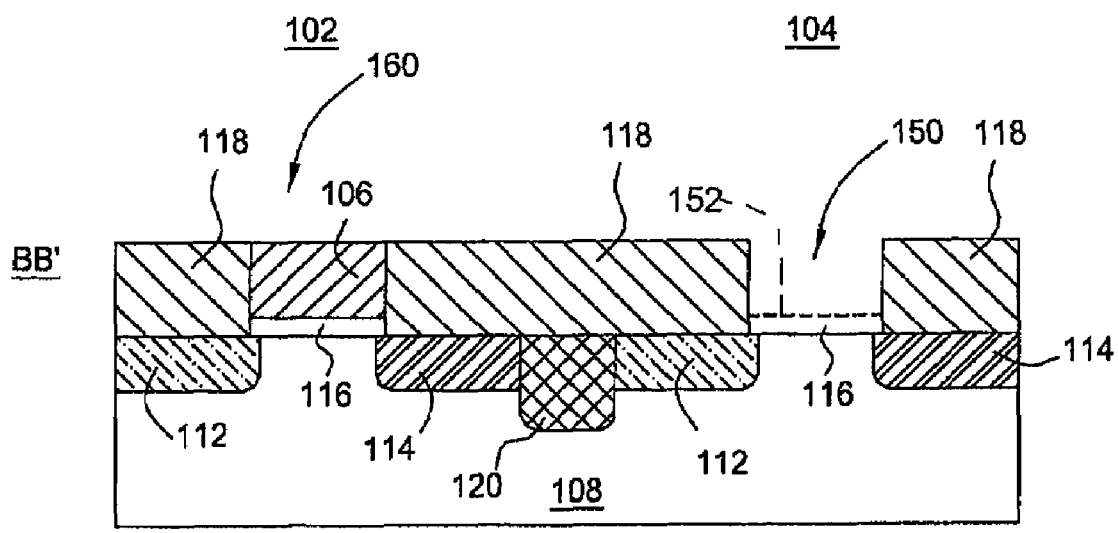

In still another embodiment, the ILD layer 118 may be a dielectric material selected from a group consisting of undoped silicon glass (USG), such as silicon oxide or TEOS, doped silicon material, such as boron-silicate glass (BSG), phosphorus-silicate glass (PSG), boron-phosphorus-silicate glass (BPSG) and combinations thereof, among others At block 204, a portion of the first gate electrode 106 is removed from the substrate 108, as shown in FIGS. 3A-3B. In the exemplary embodiment depicted in FIGS. 3A-3B, the portion of the first gate electrode 106 selected to be removed from the substrate 108 is disposed over the p-type region 104. It is noted that the portion of the first gate electrode 106 chosen to be removed from the substrate 108 may be located over different regions of the substrate 108. For example, in certain embodiments, the portion of the first gate electrode 106 chosen to be removed from the substrate 108 may be disposed over the n-type region 102, p-type region 104 or any other locations over the substrate 108. During the first gate electrode removal process, the underlying first gate dielectric layer 116 may be optional removed from the substrate 108 (as shown in phantom by reference numeral 152 in FIGS. 3A-3B). For example, in an embodiment wherein the first gate dielectric layer 116 is desired to be different over the n-type and p-type region to provide different electrical performance, the first gate dielectric layer 116 may be removed to deposit a second gate dielectric layer having desired electrical properties, as is discussed below. As the gate electrode layer 106 circumscribed by the ILD layer 118 is removed from the region over the p-type region 104, a trench 150 is defined and exposed within the ILD layer 118 is thereby exposed, as shown in a cross sectional view of the gate structure 160 in FIG. 3B. As discussed, the underlying gate dielectric layer 116 may be optionally removed or remained on the substrate 108 (as shown in phantom by reference numeral 152 of FIG. 3B).

In one embodiment, the first gate electrode 106 may be removed from the p-type region 104 by an etching process. During etching, a mask layer, such as a photoresist layer or an etch mask layer, may be utilized to protect the regions where the materials are not intended to be etched or removed. For example, a mask layer may be utilized to deposit on the n-type region 102 of the substrate 108 to prevent the structures in the n-type region 102 being undesirably etched and/or damaged during the etching process. A gate electrode removal gas mixture is used to etch the first gate electrode 106 and optionally the underlying gate dielectric layer 116. In one embodiment, the gate electrode removal gas mixture includes an etching gas selected from a halogen containing gas, such as HBr, $Br_2$, $Cl_2$, $CF_4$, $C_2F_6$, $BCl_3$, and the like. An inert gas or a carrier gas, such as N$_2$, He and Ar, may be utilized during etching. In one embodiment, the etching gas may be supplied at a flow rate between about 100 sccm and about 500 sccm. The inert or the carrier gas may be supplied at a flow rate between about 0 sccm and about 500 sccm. The etching process pressure may be maintained between about 50 mTorr and about 200 mTorr. RF power generated during the etching process may be controlled at between about 0 Watts and about 1000 Watts.

Figure 4A:
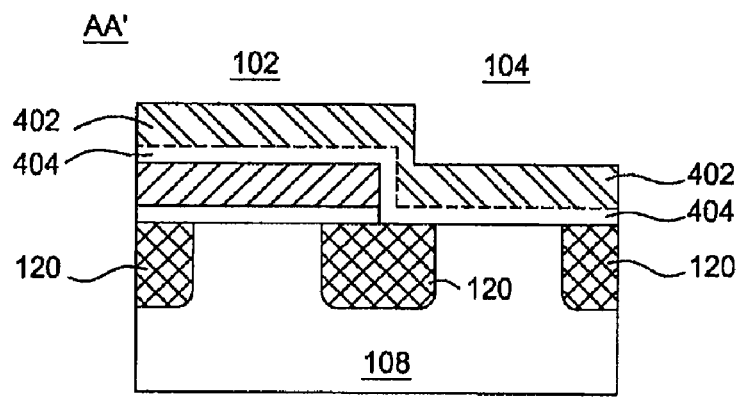
FIGS. 4A-4B depict a second gate electrode layer disposed on the field effect transistor of FIG. 3A-3B, FIGS. 5A-5B depict the transistor of FIGS. 3A-3B having different gate electrode layers formed in different regions of the transistor.
Figure 4B:
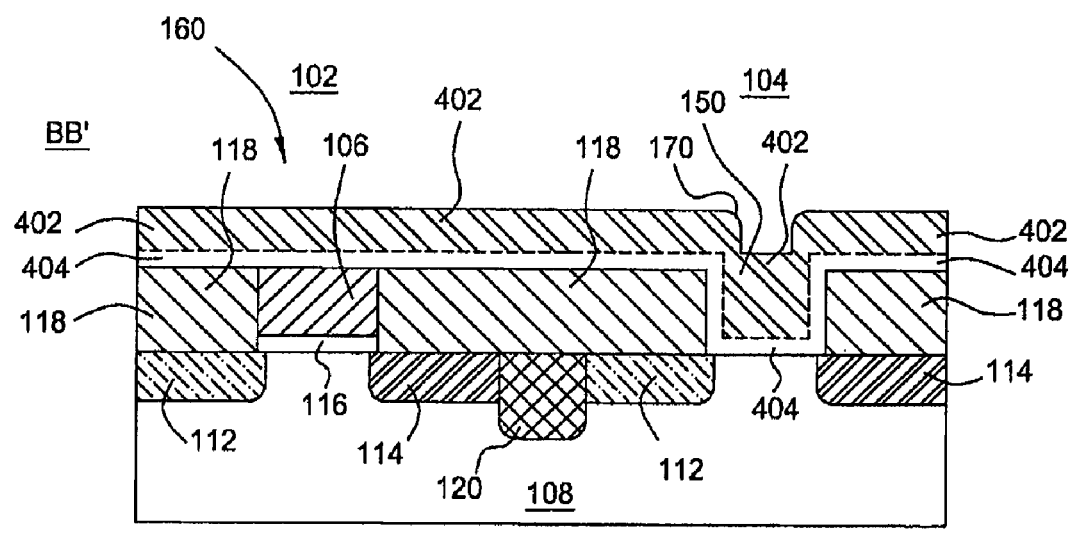

At block 206, a second gate electrode layer 402 is deposited on an optional second gate dielectric layer 404 on the substrate 108 until the trench 150 defined by the surrounding ILD layer 118 is completely filled, as shown in FIGS. 4A-4B. In one embodiment wherein the first gate dielectric layer 116 is removed from the p-type region 104 at block 204, an optional second gate dielectric layer 404 may be formed on the substrate 108 prior to the deposition of the second gate electrode layer 402. During deposition, the second gate electrode layer 402 is formed and fills in the trench 150 formed in the p-type region 104. In contrast, in n-type region 102 wherein the first gate electrode layer 106 remains on the substrate 108, the second gate electrode layer 402 may be deposited over the first gate electrode 106, thereby forming a step 170 in the region where the trench edge and ILD boundary meet. In an embodiment wherein the first gate dielectric layer 116 has been previously removed from the substrate 108, as depicted in FIGS. 4A-4B, the optional second gate dielectric layer 404 is deposited on the substrate 108 prior to the deposition of the second gate electrode layer 402. The second gate electrode layer 402 is subsequently deposited over the second gate dielectric layer 404. In the cross sectional view of the substrate 108 depicted in FIG. 4B, the second gate electrode layer 402 deposited on the substrate 108 fills in the trench 150 in the p-type region 104 defined by the surrounding ILD layer 118.

In one embodiment, the second gate electrode 402 is fabricated from a material having a work function selected to enhance performance in its region, either p-type region 104 or n-type region 102. In the embodiment wherein the second gate electrode 402 is configured to be a gate electrode in the p-type region 104 as depicted in FIGS. 4A-4B, the second gate electrode 402 may be fabricated from a material selected from a group consisting of boron doped silicon, Ru, Ni, Co, Pt, Pd and the like. In an embodiment wherein the second gate electrode 402 is alternatively configured to be a gate electrode in the n-type region 102, the second gate electrode 402 may be fabricated from a material selected from a group consisting of photosphere or arsenic doped silicon, Hf, Zr, Al, Ta, Ti, TiN, alloys thereof, combinations thereof and the like. In one embodiment, the second gate electrode 402 selected to deposit on the substrate 108 is a composite film having Ru layer formed over a TiN layer deposited by an atomic layer deposition process (ALD).

In an embodiment wherein the second gate dielectric layer 404 is deposited in the p-type region 104, the second gate dielectric layer 404 may be fabricated from a material similar to the first gate dielectric layer 116. For example, the optional second gate dielectric layer 404 may be fabricated from a high-k selected from a group consisting of silicon oxide (SiO$_2$), silicon nitride (SiN), silicon oxynitride (SiON), hafnium oxide (HfO), hafnium silicate (HfSiO$_4$), hafnium disilicate (HfSi$_4$O$_7$), zirconium oxide (ZrO), zirconium silicate (ZrSiO$_4$), tantalum oxide (Ta$_2$O$_5$), titanium oxide (TiO$_2$), titanium nitride (TiN), tantalum nitride (TaN), tantalum silicon nitride (TaSiN), aluminum oxide, aluminum doped hafnium dioxide, bismuth strontium titanium (BST), and platinum zirconium titanium (PZT), among others. In another embodiment, the second gate dielectric layer 404 may be fabricated from a material selected to work with the upper second gate electrode 402 to achieve an optimal device work function for its associated region, either n-type or p-type region. For example, the second gate dielectric layer 404 may be fabricated from hafnium silicate in p-type region and the first gate dielectric layer 116 may be fabricated from hafnium oxide in n-type region.

Figure 5A:
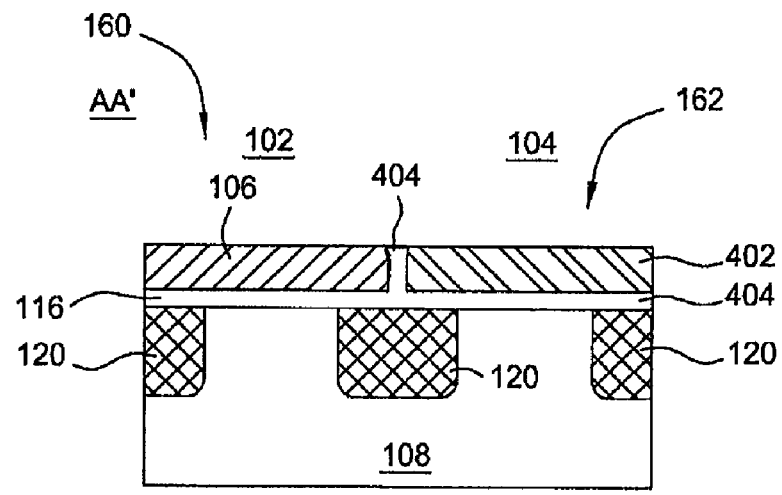
Figure 5B:
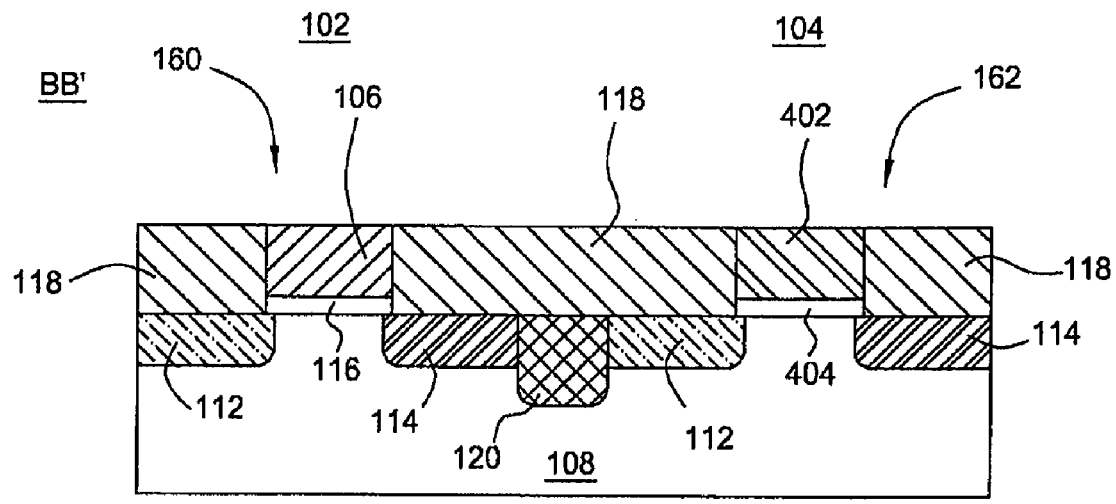

At block 208, a planarization process is performed to remove the excess material from layer comprising the second gate electrode 402 from the regions surrounding the trench 150, as depicted in FIGS. 5A-5B. The planarization process removes the step 170 defined on the substrate 108 so that the first and the second gate electrode 106, 402 are both substantially coplanar and have a substantially equal thickness. The planarized second gate electrode 404 forms a new gate structure 162 in the p-type region 104 that has different gate electrode material and/or gate dielectric material as compared to the materials comprising the original gate structure 160 in the n-type region 102. As depicted in FIG. 5A, the planarization process polishes the excess second gate electrode 402 from the substrate surface, exposing the underlying second gate dielectric layer 404. In the cross sectional view of the substrate 108 in FIG. 5B, the portion of the second gate electrode 402 adjacent the trench 150 is removed. The resultant gate structures 160, 162 thus have different gate electrode materials 402, 106 in the p-type region 104 and the n-type region 102 of the substrate 108. In this manner, the gate electrode material and/or the gate dielectric material disposed in the n-type region 102 and p-type region 104 may be independently controlled to provide a tunable work function gate structure in different regions of the substrate 108.

In one embodiment, the planarization process performed to remove the excess second gate electrode 402 is a conventional chemical mechanical polishing (CMP) process. An example of a suitable CMP system is the REFLEXION® CMP System, available from Applied Materials, Inc., Santa Clara, Calif. In another embodiment, the planarization process may be a conventional etching back process utilized to planarize a substrate surface. In yet another embodiment, the planarization process may be a technique suitable to planarize a substrate surface.

Figure 6A:
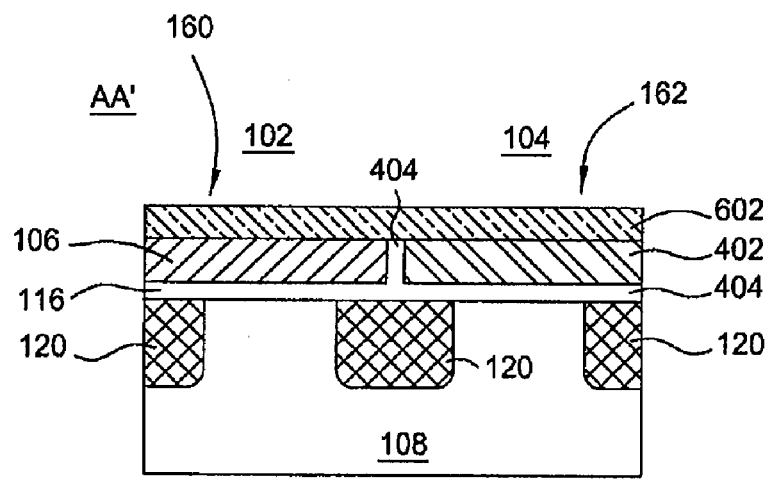
FIGS. 6A-6B depict a metal layer disposed on the formed transistors for silicidation process.
Figure 6B:
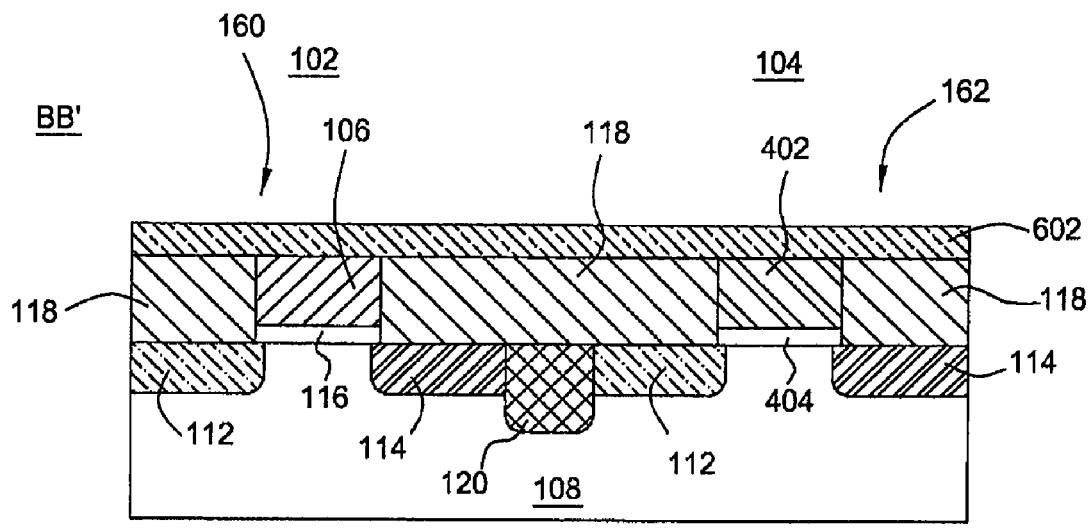

At block 210, an optional metal deposition process may be performed to deposit a metal layer 602 on the substrate 108, as depicted in FIGS. 6A-6B. In one embodiment, the metal layer 602 may be fabricated from a material capable of reacting with the underlying gate electrode layers 106, 402 to form a metal silicide layer after subsequent thermal processes. Suitable examples of the metal material include nickel (Ni), cobalt (Co), tungsten (W), titanium (Ti), hafnium (Hf), alloys thereof, or any combination thereof. In one embodiment, the metal layer 602 may be deposited on the substrate 108 by a physical vapor deposition technique (PVD), a CVD technique, a sputter technique, an atomic layer deposition technique, or other suitable deposition method. In another embodiment, the metal layer 602 may be deposited at a temperature between about 10 degrees Celsius and about 600 degrees Celsius during the deposition process, such as 250 degrees Celsius and 450 degrees Celsius by a PVD, CVD or an ALD process. It is noted that metal layers deposited over other portions of the substrate 108, e.g., the ILD 118, may be removed by conventional etching steps after silicidation process utilized in the semiconductor devices manufacture.

Figure 7A:
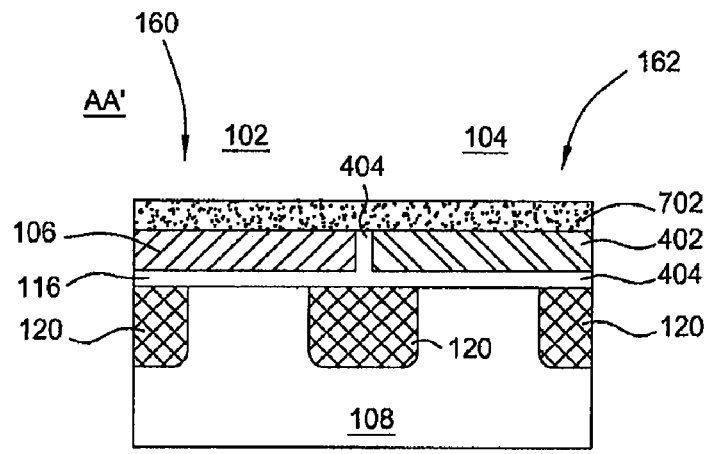
FIG. 7A-7B depict a metal silicide layer formed on the transistors.
Figure 7B:
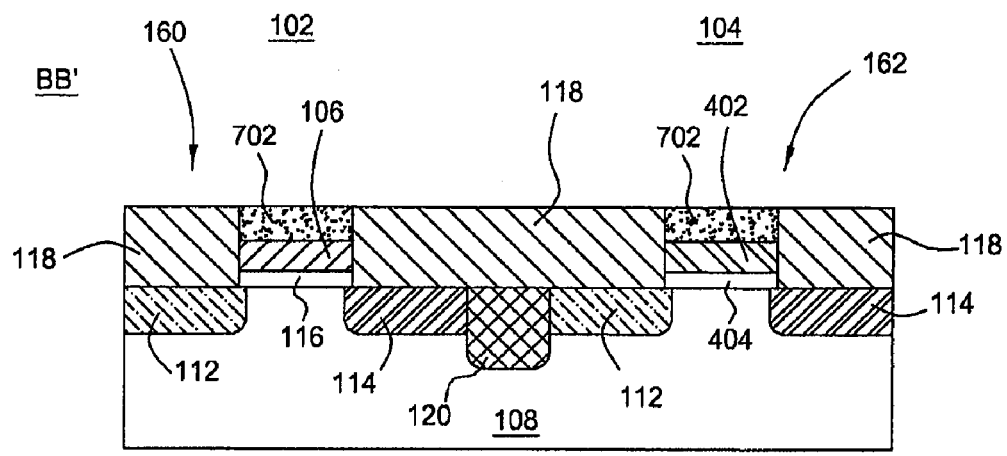

At block 212, an optional thermal annealing process is performed to convert the metal layer 602 into a metal silicide layer 702, as depicted in FIGS. 7A-7B. During thermal process, the metal atoms from the metal layer 602 diffuse and are thermally driven into the underlying gate electrodes 106, 402, forming the metal silicide layer 702. In the embodiment wherein the underlying gate electrodes 106, 402 are doped silicon layers, such as boron doped silicon or phosphorus doped silicon, the silicon atoms in the gate electrodes 106, 402 react with the metal atoms from the metal layer 602, converting upper portion of the gate electrodes 106, 402 into the metal silicide layer 702. As depicted in the cross sectional view of the gate structure in FIG. 7B, the metal silicide layer 702 is formed in the upper portion of the gate structure 160, 162 where the upper portion of the gate electrode 106, 402 is reacted with the metal layer 602, converting into the metal silicide layer 702.

In one embodiment, the resultant material formed as the metal silicide layer 702 is in accordance with the materials of the metal layer 602 deposited on the top of the gate electrodes 106, 402. For example, in an embodiment wherein the metal layer 602 deposited on the gate electrodes 106, 402 is a nickel (Ni) layer, the metal silicide layer 702 formed after thermal anneal process is a nickel silicide layer. It is noted that the materials utilized to form the metal silicide layer 702 may be varied to meet different device requirements.

In one embodiment, the thermal annealing process may be performed by a rapid thermal process (RTP). In another embodiment, the thermal annealing process is performed by a rapid thermal annealing (RTA) processing. It is noted that annealing process, including process time and temperature, may be varied based on different elemental dopants, dopant concentrations, metal layer material formed in the devices. An example of a suitable RTP chamber is the RADIANCE™ RTP chamber, available from Applied Materials, Inc., Santa Clara, Calif. Other annealing chambers, including those from other manufacturers, may be utilized to perform the thermal anneal process of the block 212. Details of thermal activation processes that may be used to practice the invention is described in commonly assigned U.S. patent application Ser. No. 10/784,904 filed on published on Feb. 23, 2004, to Ma, et. al, and is herein incorporated by reference.

Figure 8:
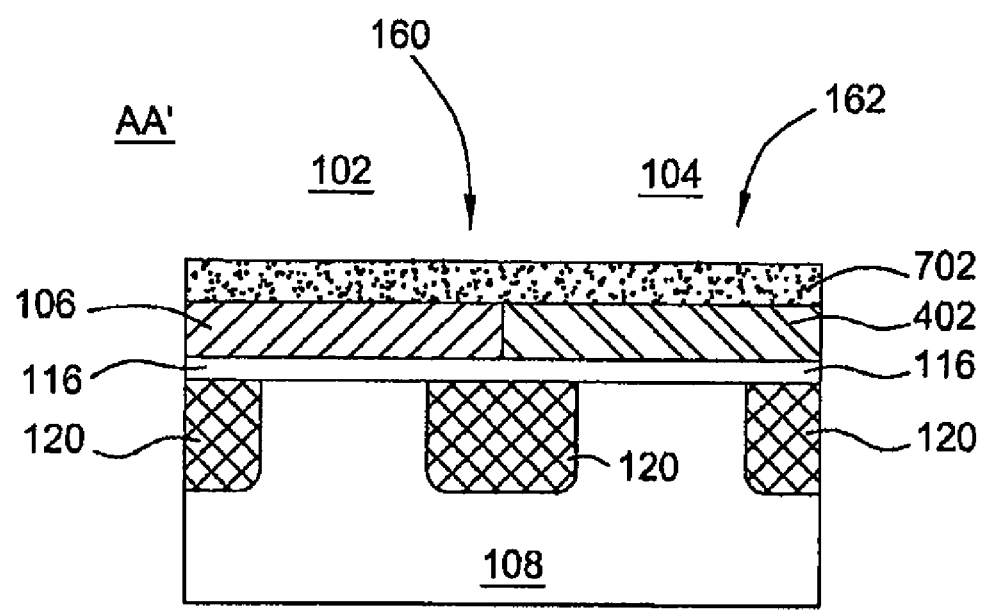
FIG. 8 depicts an alternative embodiment of transistors having different gate electrode layers formed in different regions of the transistors.

After the annealing process, the optional second gate dielectric layer 404 remaining at the interface between the first electrode 106 and the second electrode 402 may also be converted as part of the metal silicide layer 702. In the embodiment wherein the optional second gate dielectric layer 404 is not present, the first gate electrode 106 is laterally in contact with the second gate electrode 118 and the upper portion of the both electrodes 106, 402 are converted to the metal silicide layer 702 as desired, as depicted in FIG. 8.

Thus, the present invention provides a method for fabricating dual material gate structures in semiconductor devices. The dual material gate structures have different gate electrode materials and/or gate dielectric materials in different regions of the devices. The dual material gate structures advantageously provide different selectivity of work function in different regions of the device, thereby independently controlling the electrical performance in different regions of the devices. Accordingly, a tunable work function of a gate structure in devices is therefore obtained.

While the foregoing is directed to embodiments of the present invention, other and further embodiments of the invention may be devised without departing from the basic scope thereof, and the scope thereof is determined by the claims that follow.

What is claimed is:

1. A method for fabricating dual material gate structures on a substrate, comprising:
   providing a substrate having a patterned first gate electrode and a patterned first gate dielectric layer disposed on the substrate;
   removing a portion of the first gate electrode from the substrate to expose a portion of the first gate dielectric layer disposed thereunder and define a trench on the substrate, wherein the portion of the first gate electrode is removed by an etching gas mixture comprising at least one of HBr, $Br_2$, $Cl_2$, $CF_4$, and $C_2F_6$;
   removing the exposed portion of the first gate dielectric layer; and
   filling the trench to form a second gate electrode.

2. The method for fabricating dual material gate structures on a substrate according to claim 1, wherein filling the trench further comprises:
   forming a second gate dielectric layer on the substrate prior to forming the second gate electrode.

3. The method for fabricating dual material gate structures on a substrate according to claim 1, further comprising:
   planarizing the substrate until the remaining portion of the first gate electrode is exposed.

4. The method for fabricating dual material gate structures on a substrate according to claim 1, wherein the first patterned gate dielectric layer and the first patterned gate electrode are circumscribed by a dielectric layer.

5. The method for fabricating dual material gate structures on a substrate according to claim 1, wherein the trench defined by the removed first gate electrode is surrounded by a dielectric layer located in a first region of the substrate.

6. A method for fabricating dual material gate structures on a substrate, comprising:
   providing a substrate having a patterned first gate electrode and a patterned first gate dielectric layer disposed on the substrate;
   removing a portion of the first gate electrode from the substrate to define a trench on the substrate, wherein the portion of the first gate electrode is removed by an etching gas mixture comprising at least one of HBr, $Br_2$, $Cl_2$, $CF_4$, and $C_2F_6$; and
   filling the trench to form a second gate electrode, wherein a second gate dielectric layer disposed outside of the trench is removed by a planarization process.

7. A method for fabricating dual material gate structures on a substrate, comprising:
   providing a substrate having a dielectric layer disposed thereon, wherein the dielectric layer has a first group of trenches disposed on a first region of the substrate and a second group of trenches disposed on a second region of the substrate, wherein the trenches are filled with a first gate electrode disposed on a first gate dielectric layer;
   etching a portion of the first gate electrode disposed in the first group of the trenches formed on the first region of the substrate by a gas mixture comprising at least one of HBr, $Br_2$, $Cl_2$, $CF_4$, and $C_2F_6$;
   depositing a second gate electrode over the dielectric layer and filling first group of the trenches with the second gate electrode; and
   removing a portion of the second gate electrode not filling the first group of trenches.

8. The method for fabricating dual material gate structures on a substrate according to claim 7, wherein removing the second gate electrode comprises:
   removing the second gate electrode to expose the underling dielectric layer.

9. The method for fabricating dual material gate structures on a substrate according to claim 7, wherein removing the second gate electrode further comprises:

planarizing the substrate until the first gate electrode remaining in the second group of the trenches is exposed.

10. The method for fabricating dual material gate structures on a substrate according to claim 9, wherein planarizing the substrate further comprises:
planarizing the substrate by a chemical mechanical polish (CMP) process.

11. The method for fabricating dual material gate structures on a substrate according to claim 7, further comprising:
depositing a metal layer on the substrate; and
thermal annealing the substrate.

12. The method for fabricating dual material gate structures on a substrate according to claim 7, wherein the first gate electrode is a n-type doped silicon layer and the second gate electrode is a p-type doped silicon layer.

13. The method for fabricating dual material gate structures on a substrate according to claim 7, wherein etching the portion of the first gate electrode further comprises:
removing the portion of the first gate dielectric layer formed in the first group of the trench disposed on the first region of the substrate.

14. The method for fabricating dual material gate structures on a substrate according to claim 7, wherein depositing the second gate electrode further comprises:
depositing a second dielectric layer prior to depositing the second gate electrode.

15. The method for fabricating dual material gate structures on a substrate according to claim 7, wherein the first and the second gate dielectric layers are selected from a group consisting of silicon oxide ($SiO_2$), silicon nitride (SiN), silicon oxynitride (SiON), hafnium oxide (HfO), hafnium silicate ($HfSiO_4$), hafnium disilicate ($HfSi_4O_7$), zirconium oxide (ZrO), zirconium silicate ($ZrSiO_4$), tantalum oxide ($Ta_2O_5$), titanium oxide ($TiO_2$), titanium nitride (TiN), tantalum nitride (TaN), tantalum silicon nitride (TaSiN), aluminum oxide, aluminum doped hafnium dioxide, bismuth strontium titanium (BST), and platinum zirconium titanium (PZT).

16. A method for fabricating dual material gate structures on a substrate, comprising:
providing a substrate having a first gate electrode disposed on a first region and a second region of the substrate, wherein the first gate electrode is a n-type doped silicon layer;
etching the first gate electrode disposed on the first region of the substrate by a gas mixture comprising at least one of HBr, $Br_2$, $Cl_2$, $CF_4$, and $C_2F_6$; and
depositing a second gate electrode on the first region of the substrate after the first gate electrode has been removed, wherein the second gate electrode is a p-type doped silicon layer.

17. The method for fabricating dual material gate structures on a substrate according to claim 16, further comprising:
planarizing the substrate until the first and the second gate electrode are coplanar.

18. The method for fabricating dual material gate structures on a substrate according to claim 16, wherein providing the substrate further comprises:
providing a first gate dielectric layer disposed on the substrate below the first gate electrode and a second gate dielectric layer disposed below the second gate electrode.

19. The method for fabricating dual material gate structures on a substrate according to claim 18, wherein the first and the second gate dielectric layer is selected from a group consisting of silicon oxide ($SiO_2$), silicon nitride (SiN), silicon oxynitride (SiON), hafnium oxide (HfO), hafnium silicate ($HfSiO_4$), hafnium disilicate ($HfSi_4O_7$), zirconium oxide (ZrO), zirconium silicate ($ZrSiO_4$), tantalum oxide ($Ta_2O_5$), titanium oxide ($TiO_2$), titanium nitride (TiN), tantalum nitride (TaN), tantalum silicon nitride (TaSiN), aluminum oxide, aluminum doped hafnium dioxide, bismuth strontium titanium (BST), and platinum zirconium titanium (PZT).

20. A method for fabricating dual material gate structures on a substrate, comprising:
providing a substrate having a first gate electrode disposed on a first region and a second region of the substrate;
etching the first gate electrode disposed on the first region of the substrate by a gas mixture comprising at least one of HBr, $Br_2$, $Cl_2$, $CF_4$, and $C_2F_6$; and
depositing a second gate electrode on the first region of the substrate after the first gate electrode has been removed, wherein providing the substrate further comprises:
providing a first gate dielectric layer disposed on the substrate below the first gate electrode and a second gate dielectric layer disposed below the second gate electrode, wherein the first gate dielectric layer is a hafnium oxide layer and the second gate dielectric layer is a hafnium silicate layer.

21. A method for fabricating dual material gate structures on a substrate, comprising:
providing a substrate having a first gate electrode disposed on a first region and a second region of the substrate;
etching the first gate electrode disposed on the first region of the substrate by a gas mixture comprising at least one of HBr, $Br_2$, $Cl_2$, $CF_4$, and $C_2F_6$; and
depositing a second gate electrode on the first region of the substrate after the first gate electrode has been removed, wherein the second gate electrode includes a Ru layer disposed over a TiN layer.

\* \* \* \* \*

UNITED STATES PATENT AND TRADEMARK OFFICE
CERTIFICATE OF CORRECTION

PATENT NO. : 7,635,648 B2  Page 1 of 1
APPLICATION NO. : 12/100557
DATED : December 22, 2009
INVENTOR(S) : Peidous et al.

It is certified that error appears in the above-identified patent and that said Letters Patent is hereby corrected as shown below:

Title Page, Item (54) and at Column 1, line 2, In the Title:

Please insert --STRUCTURE-- after GATE.

Signed and Sealed this

Ninth Day of February, 2010

David J. Kappos
*Director of the United States Patent and Trademark Office*